United States Patent
Califorrniaa

(10) Patent No.: US 6,285,303 B1
(45) Date of Patent: Sep. 4, 2001

(54) GATE TABLE DATA COMPRESSION AND RECOVERY PROCESS

(76) Inventor: Eurica Califorrniaa, P.O. Box 2328, Malibu, CA (US) 90265-7328

( * ) Notice: Subject to any disclaimer, the term of this patent is extended or adjusted under 35 U.S.C. 154(b) by 0 days.

(21) Appl. No.: 09/569,853

(22) Filed: May 12, 2000

(51) Int. Cl.$^7$ .................................................. H03M 7/40
(52) U.S. Cl. ............................................................ 341/67
(58) Field of Search ................................ 341/50, 51, 67

(56) References Cited

U.S. PATENT DOCUMENTS

| | | | | |
|---|---|---|---|---|
| 5,621,405 | * | 4/1997 | Park et al. ............................. | 341/67 |
| 5,682,156 | * | 10/1997 | Suda ...................................... | 341/67 |
| 5,867,112 | * | 2/1999 | Sano et al. ............................. | 341/67 |

* cited by examiner

*Primary Examiner*—Trong Phan

(57) ABSTRACT

A process for compressing gate table data into a parameter format and for recovering the data into as tabular format. The parameter format comprises the bases of gate table independent variables, the base of the gate table dependent variable, a k-value, and a base for the k-value. Each set of data for the independent variables is treated as a number in a first finite system of positional notation. Each number in the first finite system of positional notation points to a position in a second finite system of positional notation. Accordingly, each datum of the dependent variable is assigned a position in the second system based on corresponding data for the independent variables. Each number in the second system points to a unique gate table having independent variables defined by the first system, so that parameters of the first and second systems and a number in the second system define a gate table. The parameters of the first system are the bases of independent variables. The parameter of the second system is the base of the dependent variable. The number of different states a variable can assume is called the base of the variable. A number in the second system is called a k-value when expressed in any base (the base of the k-value) for convenience. Recovery of data in the parameter format into the tabular format is accomplished by generating an input matrix as a permutation of the bases of independent variables, converting the k-value into a number in the second system (into a number in the base of the dependent variable), and entering the number in the second system digit-by-digit as data for the dependent variable, such that correspondence between numbers in the first system and positions in the second system are preserved. In a lossless respect, the process preserves information about the functional significance of gate table data, as indicated by variable correspondences (pairings of input and output data). In a lossy respect, the process abandons information about the order in which the pairings were originally listed in a gate table, in deference to an adopted standard order.

2 Claims, No Drawings

GATE TABLE DATA COMPRESSION AND RECOVERY PROCESS

CROSS-REFERENCE TO RELATED APPLICATIONS

Not Applicable.

STATEMENT REGARDING FEDERALLY SPONSORED RESEARCH OR DEVELOPMENT

Not Applicable.

REFERENCE TO A MICROFICHE APPENDIX

Not Applicable.

BACKGROUND OF THE INVENTION

1. Field of the Invention

My invention relates to the field of data compression and recovery.

2. Relation to Prior Art

Prior art of data compression and recovery relies on redundancy in the data, of which the patent by Welch is typical. Welch, T. A., "High Speed Data Compression and Decompression Apparatus and Method", U.S. Pat. No. 4,558,302, Sperry Corporation, New York, N.Y., Filed Jun. 20, 1983, Issued Dec. 10, 1985. In contrast, my invention does not rely on redundancy in the data. Instead, my invention eliminates unnecessary information about the sequential order in which pairings of input and output data are listed in a gate table, in deference to an adopted standard order.

3. Statement of the Necessity

A gate table is also known as a truth table or logic table. The tabular format of a gate table is too bulky to be fit for use in most labels and expressions. My invention solves the problem by converting gate table information into a parameter format concise enough for use in labels and expressions.

BRIEF DESCRIPTION OF THE INVENTION

In the compression process, each datum of the dependent variable of a gate table is weighted uniquely by corresponding data for n independent variables and summed as k. The gate table is thus compressed into a parameter format comprising the sum k in some base and the bases of variables, where the number of different states a variable can assume is called the base of the variable. In the recovery process, k is converted into the base of the dependent variable and entered digit-by-digit in a way corresponding to data for the independent variables, which in turn are recovered using an orderly permutation their bases.

BRIEF DESCRIPTION OF THE SEVERAL VIEWS OF THE DRAWING

Not Applicable.

DETAILED DESCRIPTION OF THE INVENTION

The purpose of my invention is to make "gate codons" out of gate tables. The invention comprises a compression scheme. The compression scheme is a process to reversibly compress gate table data from a tabular format into a parameter format. Notably, the number of different signals a variable of digital significance can assume is called the base of the variable. Also, a gate table comprises data concerning n independent variables or inputs and one dependent variable or output. The parameter format comprises the bases of gate table independent variables, the base of the gate table dependent variable, a k-value, and a base for the k-value. The parameter format is called a gate codon. In other words, a gate codon is a compression analog of a gate table.

The compression scheme comprises a gate table data compression process. In the compression process a gate table is converted into a gate codon. The compression scheme further comprises a gate table data recovery process. In the recovery process a gate codon is decompressed or converted back into a gate table.

In the compression process, the bases of gate table data variables are determined by counting or otherwise made known. Key to the compression process is determination of the k-value. The k-value is determined as a weighted sum of $b_r \xi^{j(r)}$ over r from 0 to l−1, where $b_r$ is an rth value for the dependent variable, $\xi$ is the base of the dependent variable, and $j(r)=(a_{n,r} \ldots a_{2,r} a_{1,r})$ is a weighted sum determined by concatenation of an rth set of values for the n independent variables. The bases $\alpha_n, \ldots, \alpha_2, \alpha_1$ of the independent variables weight $j(r)$ according to positional notation. In a normalized gate table, l is the product of the bases of the independent variables. A normalized gate table is said to observe standard order when $j(r)=r$ over r. In the standard order, $k=(b_{l-1} \ldots b_1 b_0)_\xi$ expresses the k-value in base $\xi$ by concatenation of l output values. The k-value may be expressed in base K for convenience. Accordingly, the parameter format of the gate codon is given in general form as $\{\alpha_n, \ldots, \alpha_2, \alpha_1; \xi: k, k\}$.

A anathematized gate table is one in which all entries or values are expressed as single digits in some base or bases. The compression process is meant for operation on a mathematized, normalized gate table. A non-mathematized gate table can be mathematized using a substitution key. Notably, there are l! orders in which to list l pairings of input and output data in a gate table and the standard order is one of these orders.

In the recovery process, an input matrix is to be generated in the standard order based on a permutation of values given the bases of the independent variables, the k-value is to be converted from base K into base $\xi$, and the digits of the converted value of k are to be entered in the standard order one-by-one as values for the dependent variable, such that the least significant digit of k corresponds to $j(r)=0$. In accordance with the recovery process, gate table data are to be recovered in the standard order irrespective of an original order. The standard order may be taken to be preferred.

The invention is best practiced in the form of a software implementation.

I claim:

1. A gate table data compression process to make a gate codon out of a gate table in steps of:
   (a) counting or otherwise making known bases for the n independent variables of a gate table and for the one dependent variable of the gate table,
   (b) determining a value k, which may be rendered in any base for convenience, as a weighted sum of gate table data for the dependent variable, each term in the sum being composed of a given value for the dependent variable that is uniquely weighted by a weighted sum of members of a related set of values for the independent variables, (c) recording a gate codon as data in a parameter format comprising the bases of the independent variables, the base of the dependent variable, the value k, and a base for the value k.

2. A gate table data recovery process to make a gate table out of a gate codon in steps of:

(a) generating an input matrix for a gate table based on a permutation of values given the bases of the independent variables, (b) converting a value k from a given base into the base of the dependent variable, (c) entering the digits of the converted value of k one-by-one as values for the dependent variable in an order related to sets of values for the independent variables.

* * * * *